(12) United States Patent
Zhou et al.

(10) Patent No.: US 11,778,872 B2
(45) Date of Patent: Oct. 3, 2023

(54) DISPLAY PANEL

(71) Applicant: Wuhan China Star Optoelectronics Semiconductor Display Technology Co., Ltd., Wuhan (CN)

(72) Inventors: Yang Zhou, Wuhan (CN); Jaebyeung Chae, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/771,234

(22) PCT Filed: Dec. 20, 2019

(86) PCT No.: PCT/CN2019/127072
§ 371 (c)(1),
(2) Date: Jun. 10, 2020

(87) PCT Pub. No.: WO2021/068413
PCT Pub. Date: Apr. 15, 2021

(65) Prior Publication Data
US 2022/0231108 A1   Jul. 21, 2022

(30) Foreign Application Priority Data

Oct. 12, 2019   (CN) .......................... 201910966960.6

(51) Int. Cl.
 *H01L 27/12* (2006.01)
 *H10K 59/131* (2023.01)
 *H10K 59/122* (2023.01)
(52) U.S. Cl.
 CPC ....... *H10K 59/131* (2023.02); *H01L 27/1244* (2013.01); *H10K 59/122* (2023.02)

(58) Field of Classification Search
 CPC .................................................. H01L 27/1244
 See application file for complete search history.

(56) References Cited

U.S. PATENT DOCUMENTS

| | | | |
|---|---|---|---|
| 2008/0036698 A1* | 2/2008 | Kawasaki | G02F 1/1368 345/55 |
| 2014/0254111 A1* | 9/2014 | Yamazaki | H10K 59/131 361/749 |

(Continued)

FOREIGN PATENT DOCUMENTS

| CN | 106783880 A | 5/2017 |
|---|---|---|
| CN | 107994055 A | 5/2018 |

(Continued)

*Primary Examiner* — Bryan R Junge
(74) *Attorney, Agent, or Firm* — Nathan & Associates; Menachem Nathan

(57) ABSTRACT

The present invention relates to a display panel. In an aspect, a source drain electrode layer in a bending region is provided with grooves at positions corresponding to metal traces and the grooves are filled with a conductive material. By using the conductive material to connect to the metal traces, it does not have to consider stress equilibrium for the metal traces in the bending region, thereby reducing a radius of curvature of the bending and a bezel width and increasing a screen-to-body ratio. In another aspect, a pad plate is provided and the pad plate is provided with conductive bridges arranged at intervals at positions corresponding to the grooves. It can be better connected to the metal traces by the conductive bridges, preventing the conductive material from unable to connect to the metal traces.

9 Claims, 5 Drawing Sheets

(56) References Cited

U.S. PATENT DOCUMENTS

| | | | |
|---|---|---|---|
| 2017/0023979 A1 | 1/2017 | Yamazaki et al. | |
| 2017/0148826 A1* | 5/2017 | Choi | H10K 59/131 |
| 2017/0352717 A1* | 12/2017 | Choi | H10K 77/111 |
| 2018/0047938 A1 | 2/2018 | Kishimoto et al. | |
| 2018/0108722 A1 | 4/2018 | Nishikawa | |
| 2018/0123060 A1 | 5/2018 | Jang | |
| 2018/0248139 A1* | 8/2018 | Zhai | H01L 51/0097 |
| 2018/0366586 A1* | 12/2018 | Son | H01L 29/7869 |
| 2019/0012031 A1 | 1/2019 | Kim | |
| 2019/0157311 A1* | 5/2019 | Zhang | H10K 59/1315 |

FOREIGN PATENT DOCUMENTS

| | | |
|---|---|---|
| CN | 207517287 U | 6/2018 |
| CN | 108598144 A | 9/2018 |
| CN | 109559639 A | 4/2019 |
| CN | 109585511 A | 4/2019 |
| CN | 109638058 A | 4/2019 |
| CN | 109873000 A | 6/2019 |
| CN | 209150099 U | 7/2019 |
| CN | 110112196 A | 8/2019 |

\* cited by examiner

DISPLAY PANEL

FIELD OF THE DISCLOSURE

The present application relates to display technologies, and more particularly to a display panel.

DESCRIPTION OF RELATED ARTS

Organic light-emitting display devices (OLED display devices for short) are also called organic electroluminescent display devices or organic light-emitting semiconductors. The working principle of OLED is described below. When power is supplied with an appropriate voltage, anode holes and cathode charges will be combined in a light-emitting layer. Under the action of Coulomb force, they will recombine at a certain chance to form excitons in an excited state (electron-hole pairs). The excitons in this excited state are generally unstable in the environment. The excitons in the excited state recombine and transfer energy to a luminescent material, making it transition from a ground-state energy level to the excited state. By radiation and relation processes, photons are generated and light energy is released to produce light from the energy at the excited state. Depending on its recipe, three primary colors of red, green, and blue RGB, forming the basic colors, may be produced.

OLED has advantages of low voltage demand, high power saving efficiency, fast response, light weight, thin thickness, simple structure, low cost, wide viewing angle, almost infinitely high contrast, low power consumption, extremely high response speed, etc., and today has become one of the most important display technologies.

Technical Problems

With the development of display technologies, narrow bezel and high screen-to-body ratio of display panels have become a major trend. The so-called screen-to-body ratio is a ratio of a screen area to the entire device area. A higher screen-to-body ratio can bring a better visual experience to users. In order to realize the narrow bezel and high screen-to-body ratio of the display panels, it needs to bend a non-bending region of the display panel toward a side of the display panel opposite to a light emitting face. In existing arts, during bending the bending region, a radius of curvature of the bending is uncontrollable, it is easy to cause breakage of metal traces in the bending region, thereby reducing reliability of the display panels. Therefore, a new type of display panel is needed to solve above problems.

Technical Solutions

An objective of the present invention is to provide a display panel, capable of solving the problems of existing display panels caused in bending a bending region, and these problems are that a radius of curvature of the bending is uncontrollable, it is easy to cause breakage of metal traces in the bending region, reliability of the display panels is reduced, and etc.

To solve above problems, an embodiment of the present invention provides a display panel, which defines a bending region and a non-bending region and includes a substrate, an insulating layer and a source drain electrode layer. The insulating layer is disposed on the substrate. The source drain electrode layer is disposed on the insulating layer. The source drain electrode layer in the non-bending region includes a plurality of metal traces disposed at intervals. The source drain electrode layer in the bending region is provided with grooves at positions corresponding to the metal traces and the grooves are filled with a conductive material.

Further, the display panel includes a semiconductor device layer disposed on the substrate. The semiconductor device layer includes an active layer, a gate insulating layer and a gate electrode layer. The active layer is disposed on the substrate, the gate insulating layer is disposed on the active layer, and the gate electrode layer is disposed on the gate insulating layer. The insulating layer is disposed on the gate electrode layer.

Further, the display panel includes a flattening layer disposed on the source drain electrode layer; and a pixel definition layer disposed on the flattening layer, wherein the grooves penetrate the pixel definition layer and the flattening layer until the source drain electrode layer.

Further, the display panel includes a pad plate disposed at a side of the substrate away from the source drain electrode layer.

Further, the pad plate is provided with conductive bridges arranged at intervals at positions corresponding to the grooves which penetrate the pixel definition layer, the flattening layer, the source drain electrode layer, the insulating layer until penetrating the substrate.

Further, the conductive bridges are manufactured using one or more of 3D printing technology and electroplating.

Further, a later face of the pad plate contacting the substrate bended is an arc or a rectangle.

Further, the grooves are manufactured using one or more of laser, wet etching and dry etching.

Further, the conductive material includes one or more of a conductive ink, a graphene dispersion in water, and a polyaniline solution.

Further, the conductive material is filled into the grooves by printing with negative voltages using an electro-hydraulic inkjet technology.

Beneficial Effects

The present invention relates to a display panel. In an aspect, a source drain electrode layer in the bending region is provided with grooves at positions corresponding to metal traces and the grooves are filled with a conductive material. By using the conductive material to connect to the metal traces, it does not have to consider stress equilibrium for the metal traces in the bending region, thereby reducing a radius of curvature of the bending and a bezel width, increasing a screen-to-body ratio and eventually bringing the customers a better visual experience. In another aspect, a pad plate is provided and the pad plate is provided with conductive bridges arranged at intervals at positions corresponding to the grooves. It can be better connected to the metal traces by the conductive bridges, preventing the conductive material from unable to connect to the metal traces since the metal traces is too low from perspective of thickness.

DESCRIPTION OF DRAWINGS

For explaining the technical solutions used in the embodiments of the present invention more clearly, the appended figures to be used in describing the embodiments will be briefly introduced in the following. Obviously, the appended figures described below are only some of the embodiments of the present invention, and those of ordinary skill in the art can further obtain other figures according to these figures without making any inventive effort.

The components shown in the figures are labeled as follows.

Figure 1:
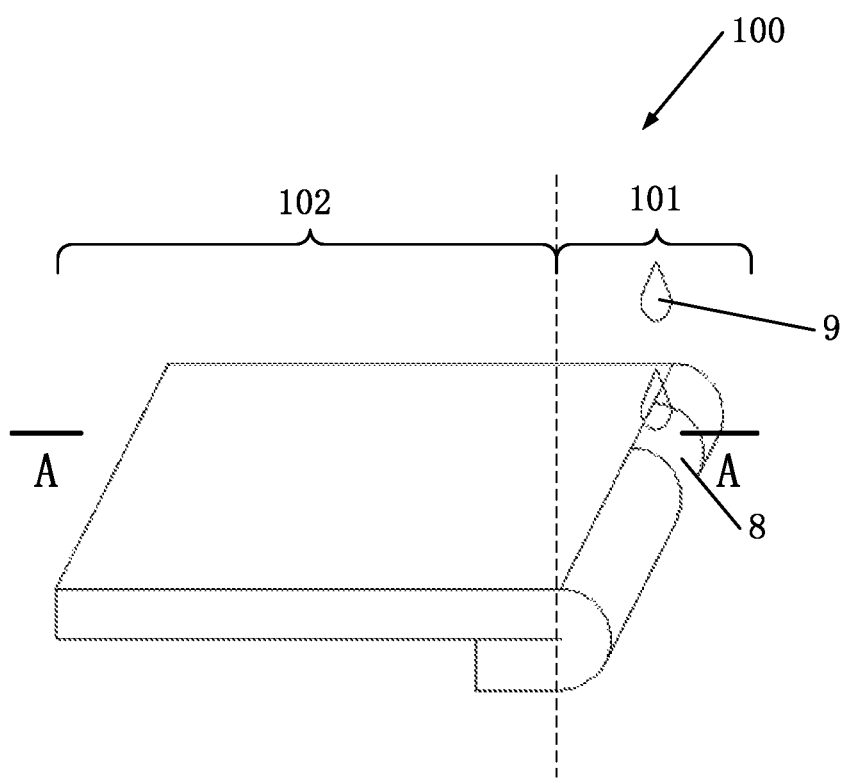
FIG. 1 is a structural schematic diagram illustrating a display panel according to Embodiment 1 of the present invention.

| | |
|---|---|
| 100 display panel | 101 bending region |
| 102 non-bending region | |
| 1 substrate | 2 semiconductor device layer |
| 3 insulating layer | 4 source drain electrode layer |
| 5 flattening layer | 6 pixel definition layer |
| 7 supporting post | 8 groove |
| 9 conductive material | 10 pad plate |
| 11 conductive bridge | 41 metal trace |

DESCRIPTION OF EMBODIMENTS OF THE DISCLOSURE

Preferred embodiments of the present invention will be described in detail below with reference to the appending drawings, to completely introduce technical content of the present invention to an ordinary person skilled in the art to prove, by examples, that the present invention can be implemented, such that the technical content disclosed in the present invention is clearer for the ordinary person skilled in the art to more easily understand how to implement the present invention. However, the present invention may be embodied in many different forms. The scope of the present invention is not limited to the embodiments set forth herein. The description of the following embodiments is not intended to limit the scope of the present invention.

In describing the present invention, spatially relative terms such as "upper", "lower", "front", "back", "left", "right", "inner", "outer", "lateral", and the like, are used herein for ease of description as illustrated in the figures. These terms are used for construing and illustrating the present invention, rather than limiting the scope of the present invention.

In the appending figures, elements with same structures are indicated by same reference numbers and components with similar structures or functions are indicated by same similar reference numbers. In addition, the size and thickness of each component shown in the drawings are arbitrarily shown for ease of understanding and description, but the present invention is not limited thereto.

When some components are described as "on" another component, the components may be directly placed on the another component. Alternatively, there is an intervening component, and the components is placed on the intervening component and the intervening component is placed on the another component. When one component is described as "mounted on" or "connected to" another component, the two can be understood as directly "mounted" or "connected", or one component is "mounted on" or "connected to" another component via an intervening component.

Embodiment 1

Figure 2:
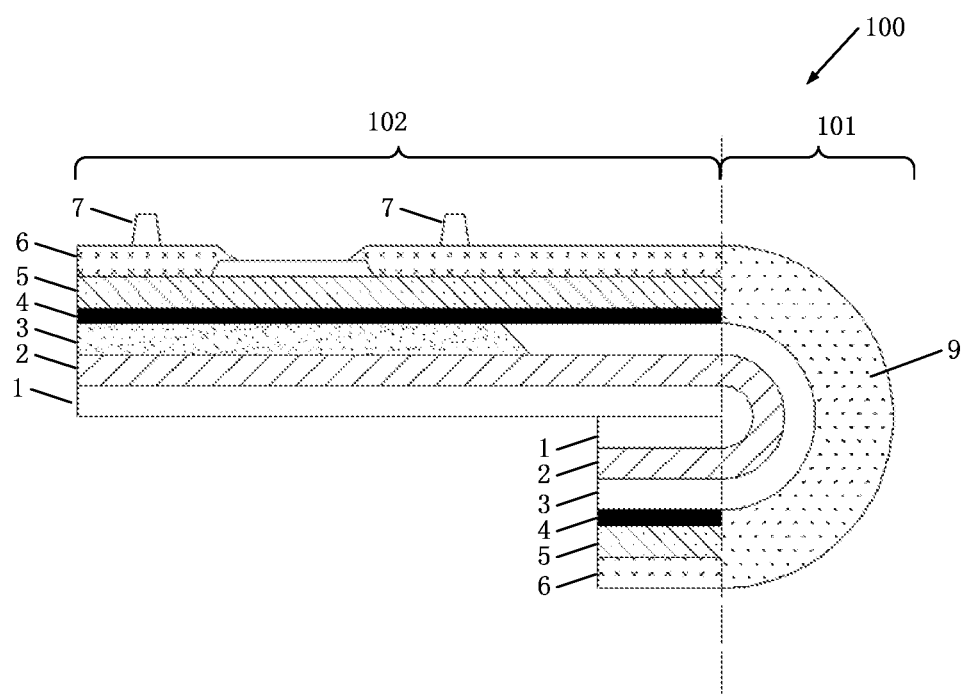
FIG. 2 is a cross-sectional view of the display panel along a A-A line according to Embodiment 1 of the present invention.

As shown in FIGS. 1 and 2, a display panel 100 defines a bending region 101 and a non-bending region 102. The display panel 100 includes a substrate 1, a semiconductor device layer 2, an insulating layer 3, a source drain electrode layer 4, a flattening layer 5, a pixel definition layer 6 and supporting posts 7.

The semiconductor device layer 2 is disposed on the substrate 1. Specifically, the semiconductor device layer 2 includes an active layer, a gate insulating layer and a gate electrode layer. The active layer is disposed on the substrate, the gate insulating layer is disposed on the active layer, and the gate electrode layer is disposed on the gate insulating layer, and their details are not covered here.

The insulating layer 3 is disposed on the semiconductor device layer 2. Specifically, the insulating layer 3 is disposed on the gate electrode layer. The insulating layer 3 mainly plays a role of insulation for avoiding a short caused by a direct contact between the source drain electrode layer 4 and the gate electrode layer of the semiconductor device layer 2, affecting a display on the display panel 100.

The source drain electrode layer 4 is disposed on the insulating layer 3. The flattening layer 5 is disposed on the source drain electrode layer 4. The pixel definition layer 6 is disposed on the flattening layer 5. The supporting posts 7 are disposed on the pixel definition layer 6.

Figure 3:
FIG. 3 is a schematic diagram illustrating a source drain electrode layer on a plane according to the present invention.

As shown in FIG. 3, the source drain electrode layer 4 in the non-bending region 102 includes a plurality of metal traces 41 disposed at intervals.

As shown in FIGS. 1 and 2, the source drain electrode layer 4 in the bending region 101 is provided with grooves 8 at positions corresponding to the metal traces 41 and the grooves 8 are filled with a conductive material 9. The grooves 8 penetrate the pixel definition layer 6 and the flattening layer 5 until the source drain electrode layer 4. By connecting the conductive material 9 to the metal traces 41, it does not have to consider stress equilibrium for the metal traces 41 in the bending region 101, thereby reducing a radius of curvature of the bending and a bezel width, increasing a screen-to-body ratio and eventually bringing the customers a better visual experience.

Actually, the grooves 8 may also penetrate the pixel definition layer 6, the flattening layer 5, the source drain electrode layer 4, the insulating layer 3, the semiconductor device layer 2 and the substrate 1 from top to bottom. By filling the conductive material 9 into the grooves 8, it can also connect to the metal traces 41. In such a way, it does not have to consider stress equilibrium for the metal traces 41 in the bending region 101, thereby reducing a radius of curvature of the bending and a bezel width, increasing a screen-to-body ratio and eventually bringing the customers a better visual experience.

Specifically, the grooves 8 are manufactured using one or more of laser, wet etching and dry etching. Among them, the wet etching is a pure chemical reaction process, referring to using a chemical reaction between a solution and a to-be-etched material to remove the parts not masked by a mask film material to achieve the purpose of etching. It has advantages of good selectivity, good repeatability, high production efficiency, simple equipment and low cost. There are many types of dry etching approaches, including sputtering and ion beam etching, plasma etching, high-pressure plasma etching, high-density plasma (HDP) etching, and reactive ion etching (RIE). It has advantages of good anisotropy, high selection ratio, good controllability, flexibility and repeatability, safe operation for thin lines, easy to carry out automation, no chemical waste liquid, no pollution caused during processing, and high cleanliness.

The conductive material 9 includes one or more of a conductive ink, a graphene dispersion in water, and a polyaniline solution. The conductive ink is a paste-like ink mainly made of a conductive material (e.g., gold, silver, copper, and carbon) dispersed in a binder, and is commonly referred to as a paste ink.

Embodiment 2

Figure 4:
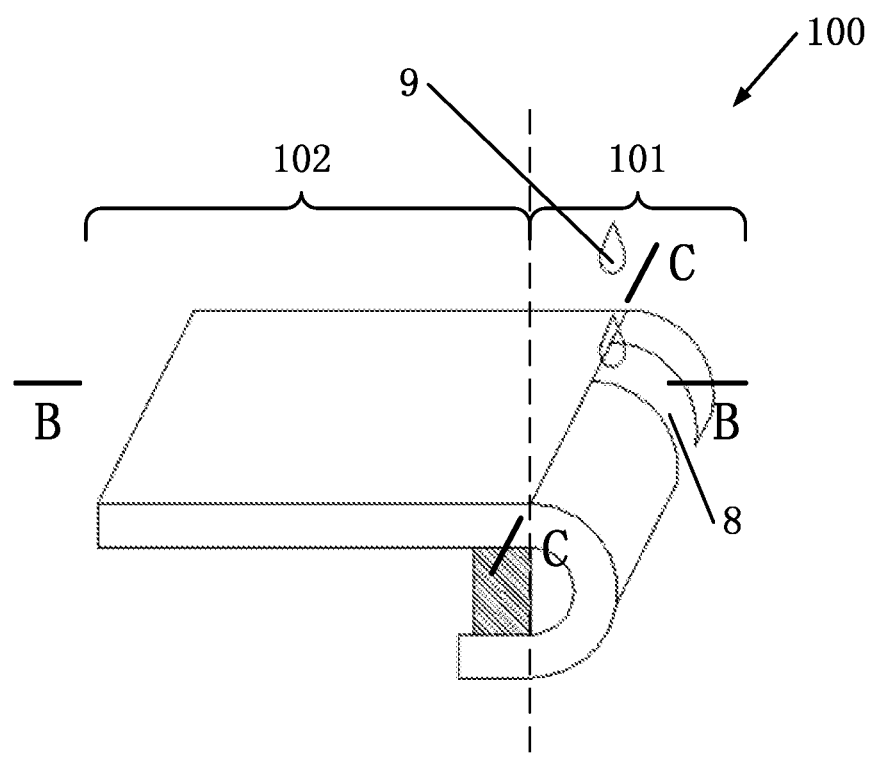
FIG. 4 is a structural schematic diagram illustrating a display panel according to Embodiment 2 of the present invention.
Figure 5:
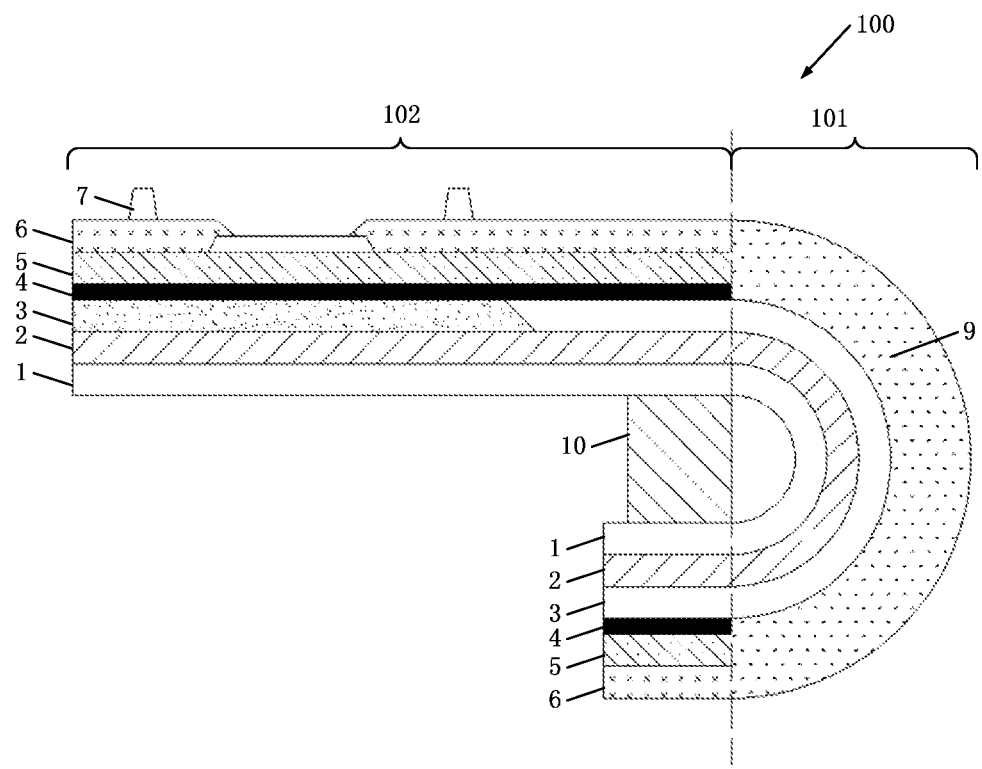
FIG. 5 is a cross-sectional view of the display panel along a B-B line according to Embodiment 2 of the present invention.

As shown in FIGS. 4 and 5, the display panel 100 described in the present embodiment further includes a pad plate 10 disposed at a side of the substrate 1 away from the source drain electrode layer 4. In the present embodiment, a lateral face of the pad plate 10 contacting the bended substrate 1 is a rectangle. The grooves 8 may penetrate the pixel definition layer 6 and the flattening layer 5 until the source drain electrode layer 4, and then a conductive material is filled into the grooves 8. In such a way, the metal traces 41 can be connected. Accordingly, it does not have to consider stress equilibrium for the metal traces 41 in the bending region 101, thereby reducing a radius of curvature of the bending and a bezel width, increasing a screen-to-body ratio and eventually bringing the customers a better visual experience.

Figure 6:
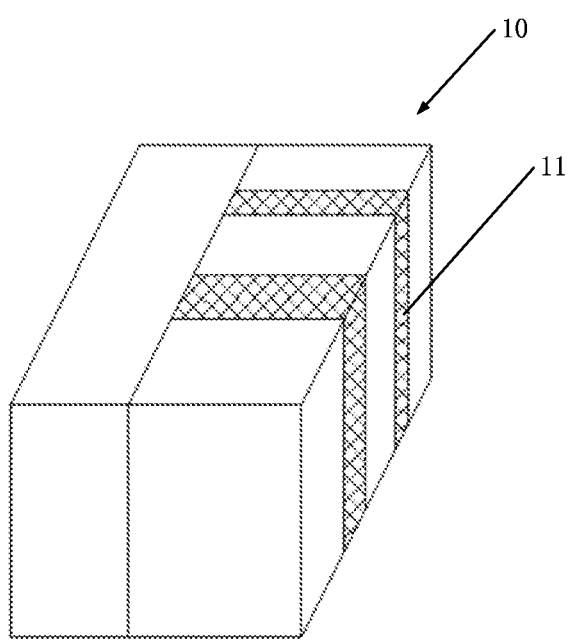
FIG. 6 is a structural schematic diagram illustrating a pad plate according to Embodiment 2 of the present invention.
Figure 7:
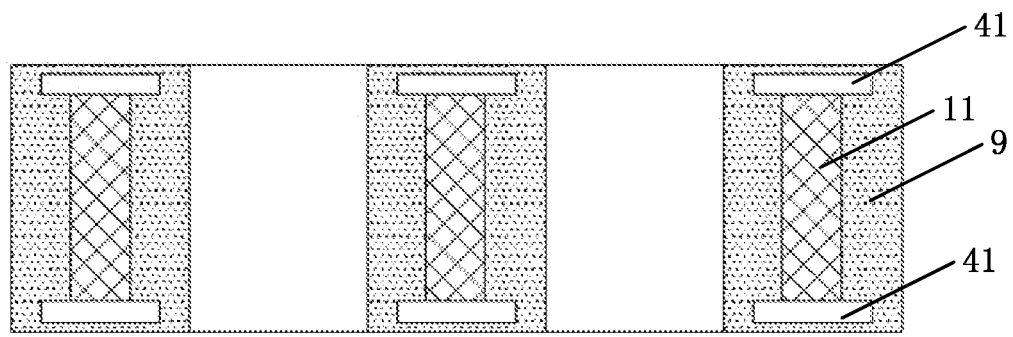
FIG. 7 is a cross-sectional view of the display panel along a C-C line according to Embodiment 2 of the present invention.

Preferably, as shown in FIGS. 6 and 7, the pad plate 10 is provided with conductive bridges 11 arranged at intervals at positions corresponding to the grooves 8. Meanwhile, the grooves 8 should penetrate the pixel definition layer 6, the flattening layer 5, the source drain electrode layer 4, the insulating layer 3, the semiconductor device layer 2 and the substrate 1 from top to bottom; or else, the conductive bridges 11 cannot cooperate with the conductive material 9 to achieve the connection with the metal traces 41. Accordingly, it can be better connected to the metal traces 41 by the conductive bridges 11, preventing the conductive material 9 from unable to connect to the metal traces 41 since the metal traces 41 is too low from perspective of thickness.

The conductive bridges 11 are manufactured using one or more of 3D printing technology and electroplating. The 3D printing technology belongs to one of rapid prototyping technologies. It is a technology based on a digital model file, which uses adhesive materials, such as powder-like metal or plastic, to stack and build up objects layer by layer (i.e., additive manufacturing). The most prominent advantage of the 3D printing technology is that it can generate parts of any shape directly from computer graphic data without machining or any molds, thereby greatly shortening product development cycle, increasing productivity and reducing production cost. The electroplating is a process of plating a thin layer of other metals or alloys on surfaces of some metals based on the principle of electrolysis, and is a technology utilizing the electrolysis for adhering a layer of metal film on the surface of a member made of metal or other materials, thereby preventing metal oxidation (such as rust), improving abrasion resistance, electrical conductivity, reflection and corrosion resistance (copper sulfate, etc.), and improving aesthetic. The electroplating can enhance corrosion resistance for metals (most of coating metals are corrosion-resistant metals), increase hardness, prevent abrasion, and improve electrical conductivity, smoothness, heat resistance and surface beauty.

Embodiment 3

Figure 8:
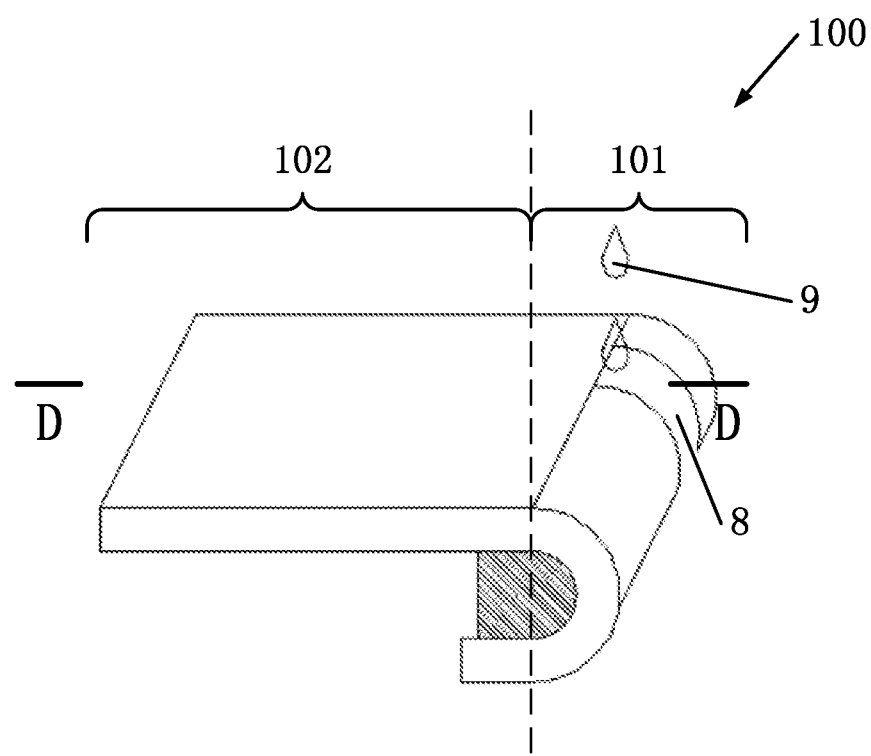
FIG. 8 is a structural schematic diagram illustrating a display panel according to Embodiment 3 of the present invention.
Figure 9:
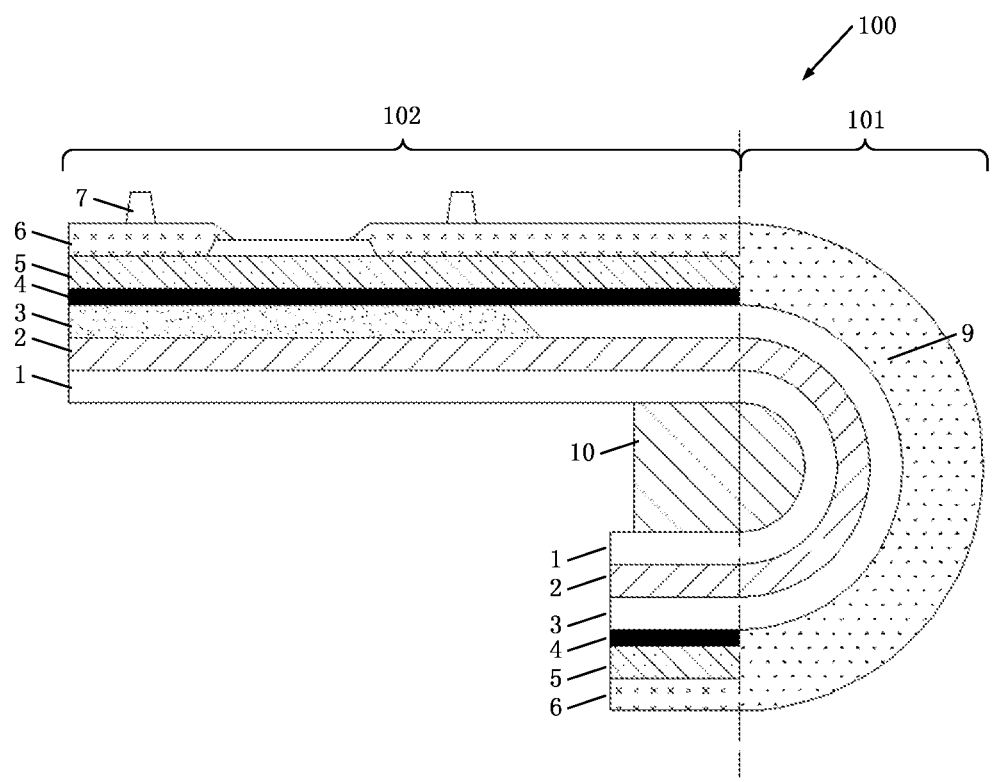
FIG. 9 is a cross-sectional view of the display panel along a D-D line according to Embodiment 3 of the present invention.

As shown in FIGS. 8 and 9, the difference between the present embodiment and Embodiment 2 is that the display panel 100 further includes a pad plate 10 disposed at a side of the substrate 1 away from the source drain electrode layer 4, wherein a lateral face of the pad plate 10 contacting the bended substrate 1 is an arc in the present embodiment. The grooves 8 may penetrate the pixel definition layer 6 and the flattening layer 5 until the source drain electrode layer 4, and then a conductive material is filled into the grooves 8. In such a way, the metal traces 41 can be connected. Accordingly, it does not have to consider stress equilibrium for the metal traces 41 in the bending region 101, thereby reducing a radius of curvature of the bending and a bezel width, increasing a screen-to-body ratio and eventually bringing the customers a better visual experience.

Figure 10:
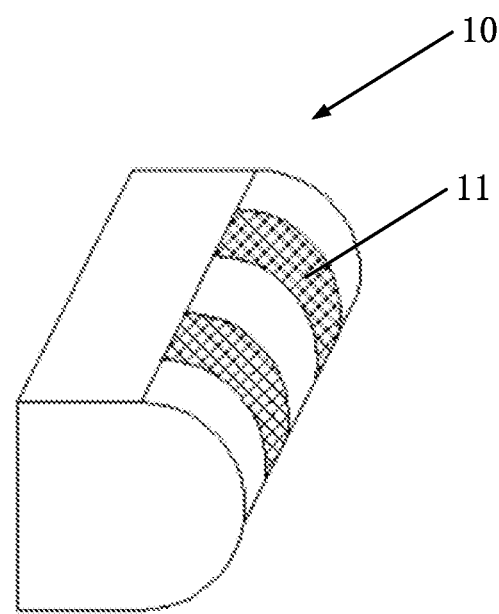
FIG. 10 is a structural schematic diagram illustrating a pad plate according to Embodiment 3 of the present invention.

Preferably, as shown in FIG. 10, the pad plate 10 is provided with conductive bridges 11 arranged at intervals at positions corresponding to the grooves 8. Meanwhile, the grooves 8 should penetrate the pixel definition layer 6, the flattening layer 5, the source drain electrode layer 4, the insulating layer 3, the semiconductor device layer 2 and the substrate 1 from top to bottom; or else, the conductive bridges 11 cannot cooperate with the conductive material 9 to achieve the connection with the metal traces 41. It can be better connected to the metal traces 41 by the conductive bridges 11, preventing the conductive material 9 from unable to connect to the metal traces 41 since the metal traces 41 is too low from perspective of thickness.

The detail description has been introduced above for the display panel provided in the present invention. It should be understood that the exemplary embodiments described in the context should be considered only in descriptive sense for ease of understanding the method and core idea of the present invention and not for purposes of limitation. Descriptions of features or aspects within each exemplary embodiment should typically be considered as available for other similar features or aspects in other exemplary embodiments. While the present invention has been described with reference to the exemplary embodiments, those of ordinary skill in the art are suggested that various changes and modifications may be made. The variations and modifications made within the appended claims are intended to be covered by the present invention. Any modifications, alternatives and improvements made within the spirit and principles of the present invention shall fall within the scope of the present invention.

The invention claimed is:

1. A display panel, defining a bending region and a non-bending region, the display panel comprising:
   a substrate;
   an insulating layer disposed on the substrate;
   a source drain electrode layer disposed on the insulating layer;
   a flattening layer disposed on the source drain electrode layer; and
   a pixel definition layer disposed on the flattening layer,
   wherein the source drain electrode layer in the non-bending region comprises a plurality of metal traces disposed at intervals,
   wherein the source drain electrode layer in the bending region is provided with grooves at positions corresponding to the metal traces and the grooves are filled with a conductive material,
   wherein the grooves penetrate the pixel definition layer and the flattening layer until the source drain electrode layer.

2. The display panel according to claim 1, further comprising a semiconductor device layer disposed on the substrate,
   the semiconductor device layer comprising:
   an active layer disposed on the substrate;
   a gate insulating layer disposed on the active layer; and
   a gate electrode layer disposed on the gate insulating layer,
   wherein the insulating layer is disposed on the gate electrode layer.

3. The display panel according to claim 1, further comprising a pad plate disposed at a side of the substrate away from the source drain electrode layer.

4. The display panel according to claim 3, wherein the pad plate is provided with conductive bridges arranged at intervals at positions corresponding to the grooves which penetrate the pixel definition layer, the flattening layer, the source drain electrode layer, and the insulating layer until penetrating the substrate.

5. The display panel according to claim 4, wherein the conductive bridges are manufactured using one or more of 3D printing technology and electroplating.

6. The display panel according to claim 3, wherein a lateral face of the pad plate is an arc or a rectangle.

7. The display panel according to claim 1, wherein the grooves are manufactured using one or more of laser, wet etching and dry etching.

8. The display panel according to claim 1, wherein the conductive material comprises one or more of a conductive ink, a graphene dispersion in water, and a polyaniline solution.

9. The display panel according to claim 1, wherein the conductive material is filled into the grooves by printing with negative voltages using an electro-hydraulic inkjet technology.

* * * * *